(12) United States Patent
Weinschenk et al.

(10) Patent No.: US 9,461,005 B2
(45) Date of Patent: Oct. 4, 2016

(54) RF PACKAGE WITH NON-GASEOUS DIELECTRIC MATERIAL

(71) Applicant: NXP B.V., Eindhoven (NL)

(72) Inventors: Christian Weinschenk, Nijmegen (NL); Amar Ashok Mavinkurve, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 0 days.

(21) Appl. No.: 14/620,575

(22) Filed: Feb. 12, 2015

(65) Prior Publication Data

US 2016/0240491 A1     Aug. 18, 2016

(51) Int. Cl.
| | |
|---|---|
| *H01L 23/00* | (2006.01) |
| *H01L 23/31* | (2006.01) |
| *H01L 23/495* | (2006.01) |
| *H01L 21/02* | (2006.01) |
| *H01L 21/56* | (2006.01) |

(52) U.S. Cl.
CPC ....... *H01L 23/564* (2013.01); *H01L 21/02282* (2013.01); *H01L 21/56* (2013.01); *H01L 23/3107* (2013.01); *H01L 23/4952* (2013.01)

(58) Field of Classification Search
CPC ............. H01L 23/564; H01L 23/3107; H01L 23/4952
See application file for complete search history.

(56) References Cited

U.S. PATENT DOCUMENTS

| | | | | |
|---|---|---|---|---|
| 6,982,483 | B2 * | 1/2006 | McLaughlin | H01L 23/3107 257/701 |
| 7,444,734 | B2 * | 11/2008 | Gaucher | H01Q 1/38 29/600 |
| 7,504,721 | B2 * | 3/2009 | Chen | H01P 7/10 257/691 |
| 7,651,891 | B1 * | 1/2010 | Nguyen | H01L 21/56 438/127 |
| 8,013,429 | B2 | 9/2011 | Mohammed et al. | |
| 8,779,563 | B2 * | 7/2014 | Brunnbauer | H01L 21/561 257/659 |
| 2002/0081787 | A1 | 6/2002 | Kohl et al. | |
| 2007/0164420 | A1 * | 7/2007 | Chen | H01L 25/16 257/691 |
| 2007/0273013 | A1 | 11/2007 | Kohl et al. | |

(Continued)

FOREIGN PATENT DOCUMENTS

| | | |
|---|---|---|
| EP | 0 930 644 A1 | 7/1999 |
| JP | 62-113433 | 5/1987 |

OTHER PUBLICATIONS

Reed, Hollie A. et al., "Compliant Wafer Level Package (CWLP) with embedded air-gaps for sea of Leads (SoL) Interconnections", Proceedings of the IEEE Int'l Interconnect Technology Conference, pp. 151-153, (2001).

(Continued)

*Primary Examiner* — Ida M Soward
(74) *Attorney, Agent, or Firm* — McDonnell Boehnen Hulbert & Berghoff LLP

(57) ABSTRACT

An RF package including: an RF circuit; a non-gaseous dielectric material coupled to the RF circuit, and having a thickness based on a magnetic field in the RF circuit; and an encapsulant material coupled to cover the RF circuit and non-gaseous dielectric material on at least one side of the RF circuit. A package manufacturing method, including: identifying an RF circuit; dispensing a non-gaseous dielectric material upon the RF circuit, wherein at least a portion of the non-gaseous dielectric material has a thickness based on a magnetic field in the RF circuit; and covering the RF circuit and non-gaseous dielectric material with an encapsulant material on at least one side of the RF circuit.

11 Claims, 8 Drawing Sheets

(56) References Cited

U.S. PATENT DOCUMENTS

| | | | |
|---|---|---|---|
| 2008/0191336 A1 | 8/2008 | Tsai | |
| 2008/0272475 A1 | 11/2008 | Dijkstra et al. | |
| 2009/0001614 A1* | 1/2009 | Condie | H01L 23/295 257/795 |
| 2009/0294931 A1* | 12/2009 | Sham | H01L 23/13 257/660 |
| 2010/0252923 A1* | 10/2010 | Watanabe | H01L 23/13 257/737 |
| 2012/0256306 A1* | 10/2012 | Yu | H01L 23/3107 257/676 |
| 2014/0131899 A1 | 5/2014 | Weinschenk | |
| 2015/0140736 A1* | 5/2015 | Pendse | H01L 24/19 438/109 |

OTHER PUBLICATIONS

Spencer, Todd J. et al., "Decomposition of poly(propylene carbonate) with UV sensitive iodonium salts", Polymer Degradation and Stability, vol. 96, pp. 686-702, (2011).

AOK; "AOK Heat Conductive Materials/Heat Conductive Pad"; retrieved from the internet http://www.aok-technologies.com/list/Heat-Conductive-Materials.htm Feb. 7, 2015; 2 pages; (2015).

Electronics Cooling; "The Many Flavors of Ball Grid Array Packages"; retrieved from the internet http://www.electronics-cooling.com/2002/02/the-many-flavors-of-ball-grid-array-packages/ on Feb. 8, 2015); 5 pages; (Feb. 1, 2002).

Extended European Search Report for Application No. 12192281.9 (May 13, 2013).

* cited by examiner

RF PACKAGE WITH NON-GASEOUS DIELECTRIC MATERIAL

CROSS-REFERENCE TO RELATED OR CO-PENDING APPLICATIONS

This application may relate to co-pending U.S. patent application Ser. No. 14/077,138, entitled Package For An Integrated Circuit, filed on 11 Nov. 2013, and U.S. patent application Ser. No. 14/620,601, entitled RF Package, both commonly assigned to AMPLEON NETHERLANDS B.V.

Various example embodiments of systems, methods, apparatuses, devices, articles of manufacture incorporating an RF Package are now discussed.

As electrical circuits and devices are reduced in size, resistance and capacitive coupling increase, causing an increase in signal delay (i.e. RC delay) and other electrical losses. This becomes an increasing problem as au electrical circuit's operating frequency increases (e.g. for RF circuits and devices) which further limits the circuit's performance. One technique for reducing the effect of such losses is show in FIG. 1.

FIG. 1 is an air cavity package 100. The package 100 includes a lid with open cavity 102, a lead frame 104, a dielectric ring 106 and a heat sink 108. The air cavity package 100 is built-up by stacking these elements, which thereby encapsulate a semiconductor die, internal wiring and an air cavity. Epoxy glues are used to hold these elements together.

The function of the air cavity is to provide a dielectric with low dielectric constant (e.g. k close 1.0) on top of the RF die, and perhaps also between the wire loops, to reduce electrical losses and enhance the performance of the RF product and system. The dielectric constant (k) is a measure of how easily a material is polarized in an external electric field.

SUMMARY

According to a first example embodiment, a package includes: an RF circuit; a non-gaseous dielectric material coupled to the RF circuit, and having a thickness based on a magnetic field in the RF circuit; and an encapsulant material coupled to cover the RF circuit and non-gaseous dielectric material on at least one side of the RF circuit.

In another example embodiment, the dielectric material is a low-k dielectric material.

In another example embodiment, a dielectric constant of the dielectric material is less than a dielectric constant of the encapsulant material.

In another example embodiment, the circuit includes active elements and passive elements; and the dielectric material does not cover all of the passive elements.

Another example first embodiment further includes a lead-frame and a set of bond-wires; and in such embodiment, a first bond-wire couples the circuit to the lead-frame;

the dielectric material completely covers a second bond-wire; and the encapsulant further covers the first bond-wire, the second bond-wire and a portion of the lead-frame.

Another example first embodiment further includes a second circuit completely covered by the dielectric material; and in such embodiment, the second bond-wire couples the RF circuit to the second circuit.

In another example embodiment, the RF circuit includes a device operating at a frequency of at least 1 GHz.

In another example embodiment, the circuit is a semiconductor die.

In another example embodiment, the encapsulant material is coupled to encapsulate the RF circuit and non-gaseous dielectric material.

In another example embodiment, the thickness is at least 20 µm.

According to a second example embodiment, a package includes: an RF circuit having a first portion and a second portion; a non-gaseous dielectric material coupled only to the first portion of the RF circuit; and an encapsulant material coupled to cover the RF circuit and non-gaseous dielectric material on at least one side of the RF circuit.

According to a first example method of package manufacture, the method includes: identifying an RF circuit; dispensing a non-gaseous dielectric material upon the RF circuit, at least a portion of the non-gaseous dielectric material has a thickness based on a magnetic field in the RF circuit; and covering the RF circuit and non-gaseous dielectric material with an encapsulant material on at least one side of the RF circuit.

In another example method embodiment, the non-gaseous dielectric material is dispensed upon the RF circuit after the RF circuit has been diced and affixed to a substrate.

In another example method embodiment, the non-gaseous dielectric material is dispensed upon the RF circuit after bond-wires have coupled the RF circuit to a lead-frame.

In another example method embodiment, the circuit includes active elements and passive elements; the dielectric material does not cover all of the passive elements; and the encapsulant material does cover all of the active and passive elements.

In another example method embodiment, the dielectric material is dispensed as a liquid.

In another example method embodiment, a dielectric constant of the dielectric material is less than a dielectric constant of the encapsulant material.

In another example method embodiment, the thickness of the dielectric material is greater than 20 µm.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings, in which:

Figure 1:
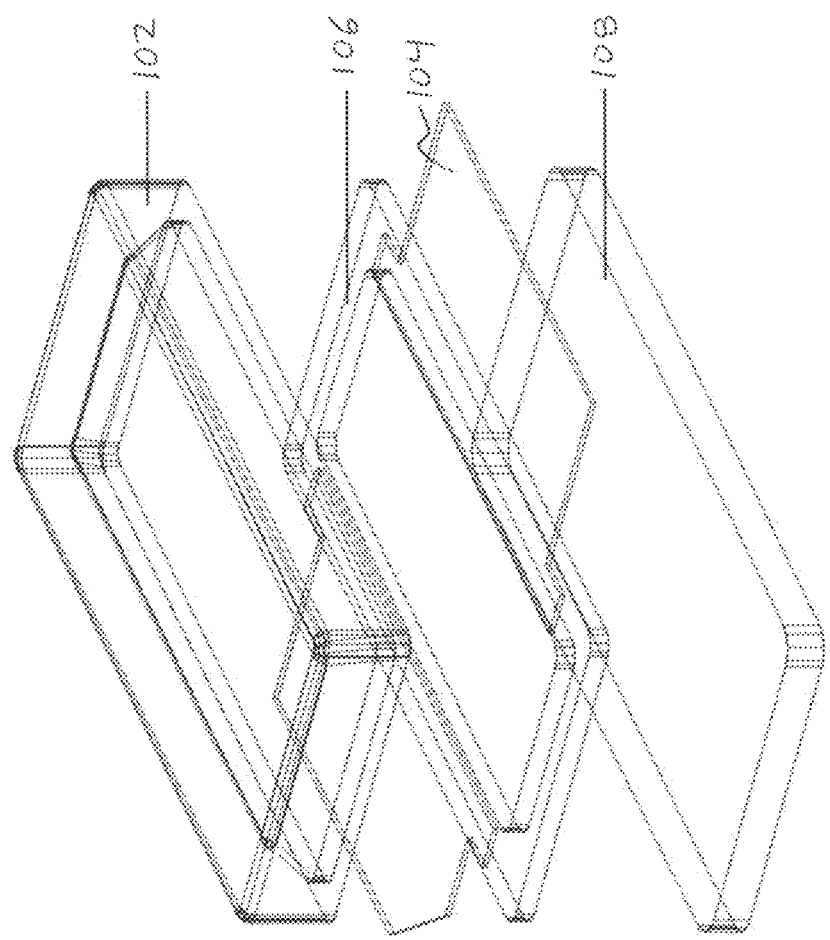
FIG. 1 is an air cavity package.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

In RF systems, semiconductor packages for RF amplifiers or RFIC's can be made by means of over-molding such that the dies and wires are covered by mold compound. Examples of this art are the QFN, HSOP and BGA package styles.

Figure 2:
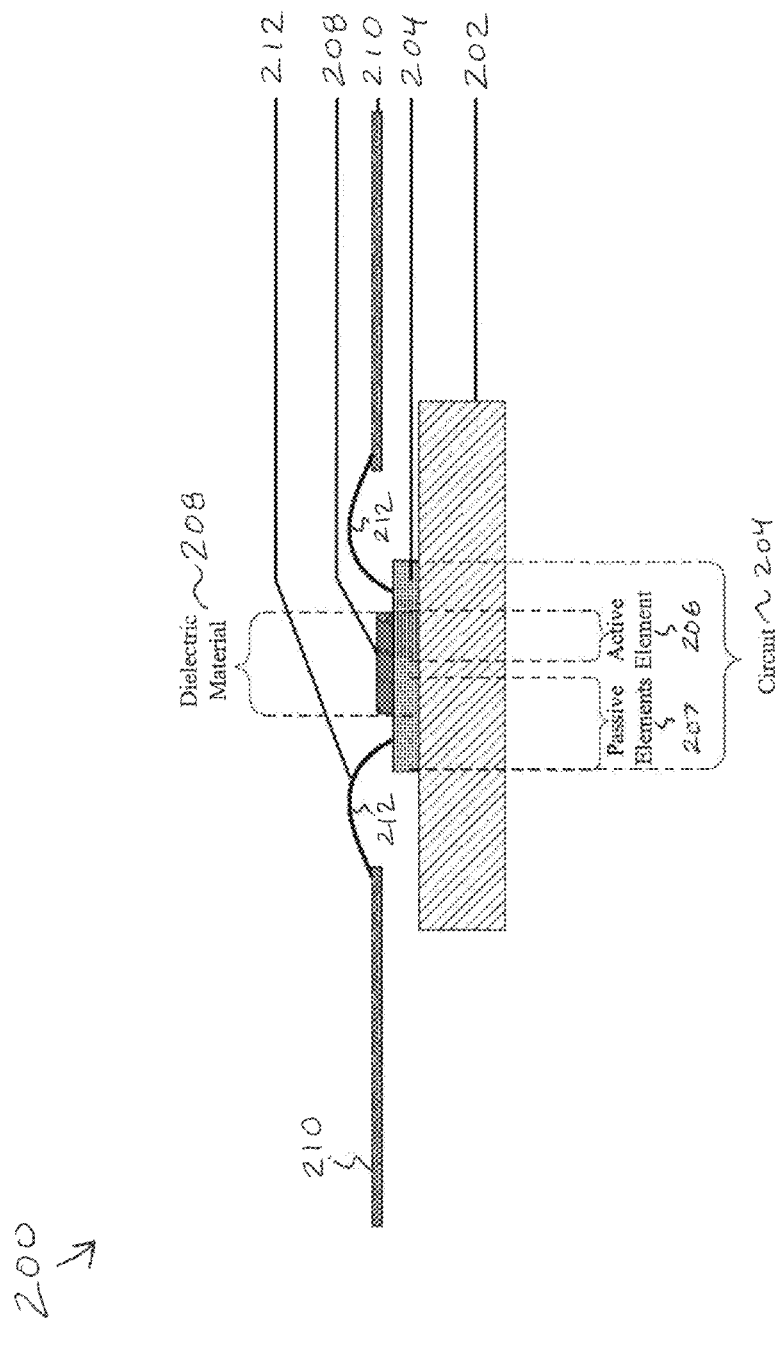
FIG. 2 shows a first example RF package.
Figure 3:
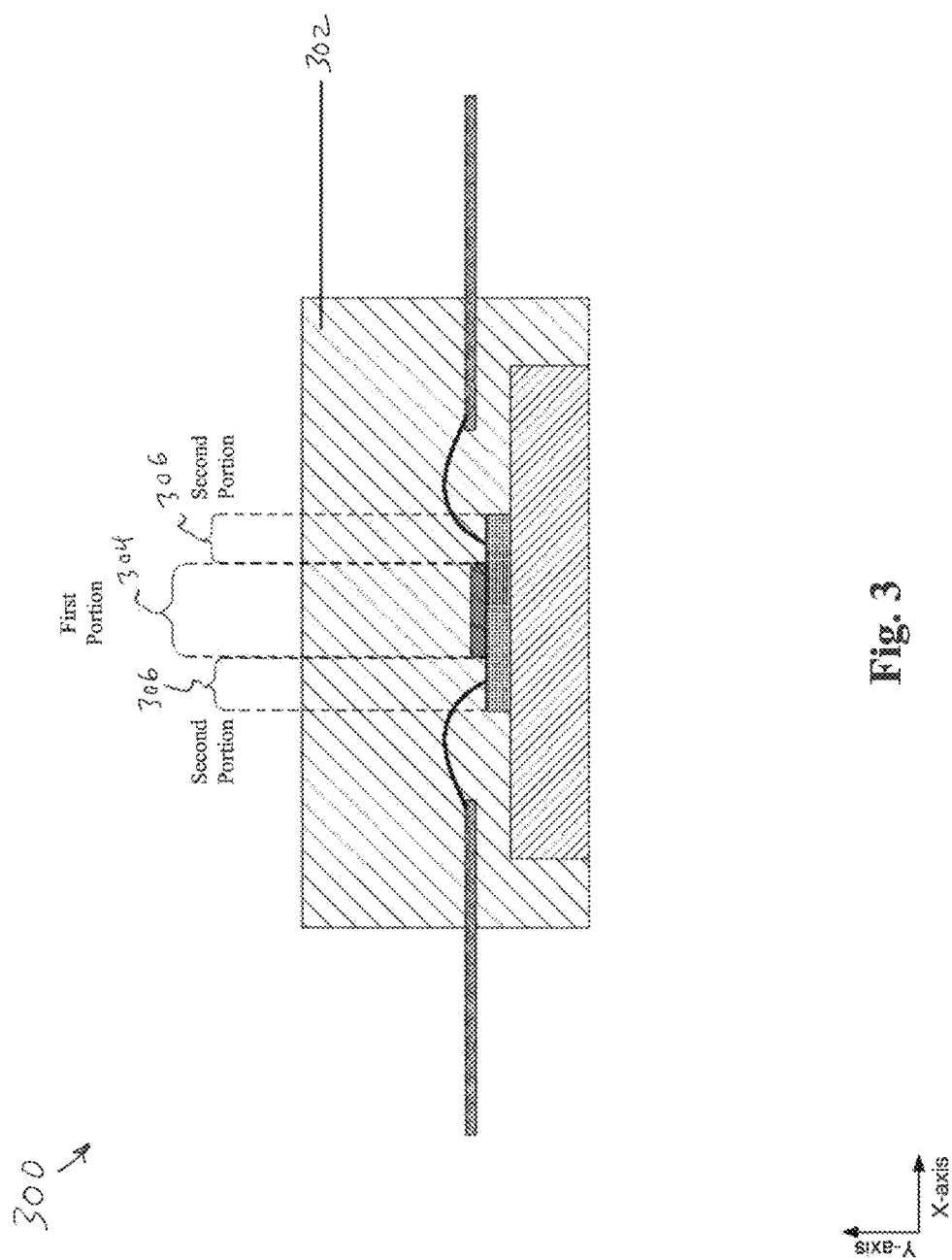
FIG. 3 shows an encapsulated version of the first example RF package.

FIG. 2 shows a first example RF package 200. FIG. 3 shows an encapsulated version 300 of the first example RF package 200. FIGS. 2 and 3 will be discussed together.

The RF circuit package 200 includes a substrate 202 (e.g. heat sink) upon which a circuit 204 (e.g. die) is affixed (e.g. bonded). In one example, the circuit 204 includes one or more active elements 206 and passive elements 207. A dielectric material 208 (e.g. an insert made of a low-k dielectric) is placed over at least one of the active elements 206. The circuit 204 is connected to a lead-frame 210 by one or more bond-wires 212. In one example an encapsulant material 302 (e.g. molding compound) covers the entire circuit 204, dielectric material 208, bond-wires 212 and at least part of the lead-frame 210. In other examples, the encapsulant material 302 may cover only part of the circuit 204, dielectric material 208 and bond-wires 212. When the encapsulant material 302 covers these element, such covering may include encapsulating one or more of these elements.

In another example embodiment, the package 200 includes: the RF circuit 204; a non-gaseous dielectric material 208 coupled to the RF circuit 204, having a lateral thickness based on a magnetic field in the RF circuit; and an encapsulant material 302 coupled to cover the RF circuit 204 and non-gaseous dielectric material 208 on at least one side of the RF circuit 204.

In various examples: the dielectric material 208 can be a low-k dielectric material 208; a dielectric constant of the dielectric material 208 is less than a dielectric constant of the encapsulant material 302; the circuit 204 includes active elements 206 and passive elements 207; or the dielectric material 208 does not cover all of the passive elements 207, but may cover some or all of the active elements 206.

The function of the dielectric material 208 is to provide a low dielectric constant (as close to 1.0 as possible) over one or more active elements 206 in the circuit 204. In one example embodiment, the dielectric constant of the dielectric material 208 is lower than that of the encapsulant material 302 (3.5-4.0), perhaps lower than 2.

The material can consist of a porous or non-porous type of dielectric material 208 with composition and viscosity such as to enable dispensing an appropriate height for the device (e.g. ranging from 20 µm to 100 µm). However in other embodiments, the height of the dielectric material 208 can be less than 20 µm, or thicker than 100 µm. Thicker coatings of the dielectric material 208 further reduce electrical losses due to electrical fields created by the RF circuit and associated circuit leads and/or bond-wires 212. The longitudinal dimensions of the dielectric material 208 depend on the area of the active elements 206, the passive elements 207 and the circuit 204 being covered.

The dielectric material 208 can be locally dispensed just onto one or more of the elements 206, 207 or circuits 204, before or after the circuits 204 are attached (e.g. bonded) to the substrate 202. Such dispensing could be as a glob-top or as a spray.

The phrase "active element" 206 can have different meanings, but in this case at least refers to amplification elements, including transistors or mosfets and any other amplification device.

"Passive elements" 207 are hereby defined as any other electrical element which is not an active element 206 (e.g. capacitors, resistors, inductors, bond-wire 212 pads, wires, etc.)

To reiterate, the dielectric material 208 can be placed just on top of the active elements 206; placed on top of both active elements 206 and passive elements 207; or also placed on the bond-wires 212 to reduce electrical losses even further and thereby further enhance the performance of the RF device.

Other examples further include a lead-frame 210 and a set of bond-wires 212. Then: a first bond-wire 212 couples the circuit 204 to the lead-frame 210; the dielectric material 208 covers or partially covers a second bond-wire 212; and the encapsulant material 302 further covers the first bond-wire 212, the second bond-wire 212 and a portion of the lead-frame 210.

In example embodiments having a second circuit 204, the second bond-wire 212 couples the RF circuit 204 to the second circuit 204. In such examples having multiple circuits 202, such circuits 204 may be interconnected with bond-wires 212 and placed within a single lead-frame 210. In such an example, not all of the package's 200 bond-wires 212 may be coupled to the lead-frame 210, since some of the bond-wires 212 are interconnecting the different circuits 204 within the package 200.

The RF circuit 204 can be a device operating at a frequency of at least 1 GHz, but in some example may be as low as 100 MHz. The circuit 204 may also be wholly embodied in a semiconductor die.

The encapsulant material 302 can be coupled to encapsulate the RF circuit 204 and non-gaseous dielectric material 208. FIG. 3 shows an example where the substrate 202 could be a heat-sink, one side of which is left exposed for effective circuit 204 cooling, and the other sides covered by the encapsulant material 302.

Alternate example embodiments of the package 200 can include: an RF circuit 204 having a first portion 304 and a second portion 306; a non-gaseous dielectric material coupled only to the first portion of the RF circuit 204; and an encapsulant material 302 coupled to cover the RF circuit 204 and non-gaseous dielectric material on at least one side of the RF circuit 204.

Figure 4:
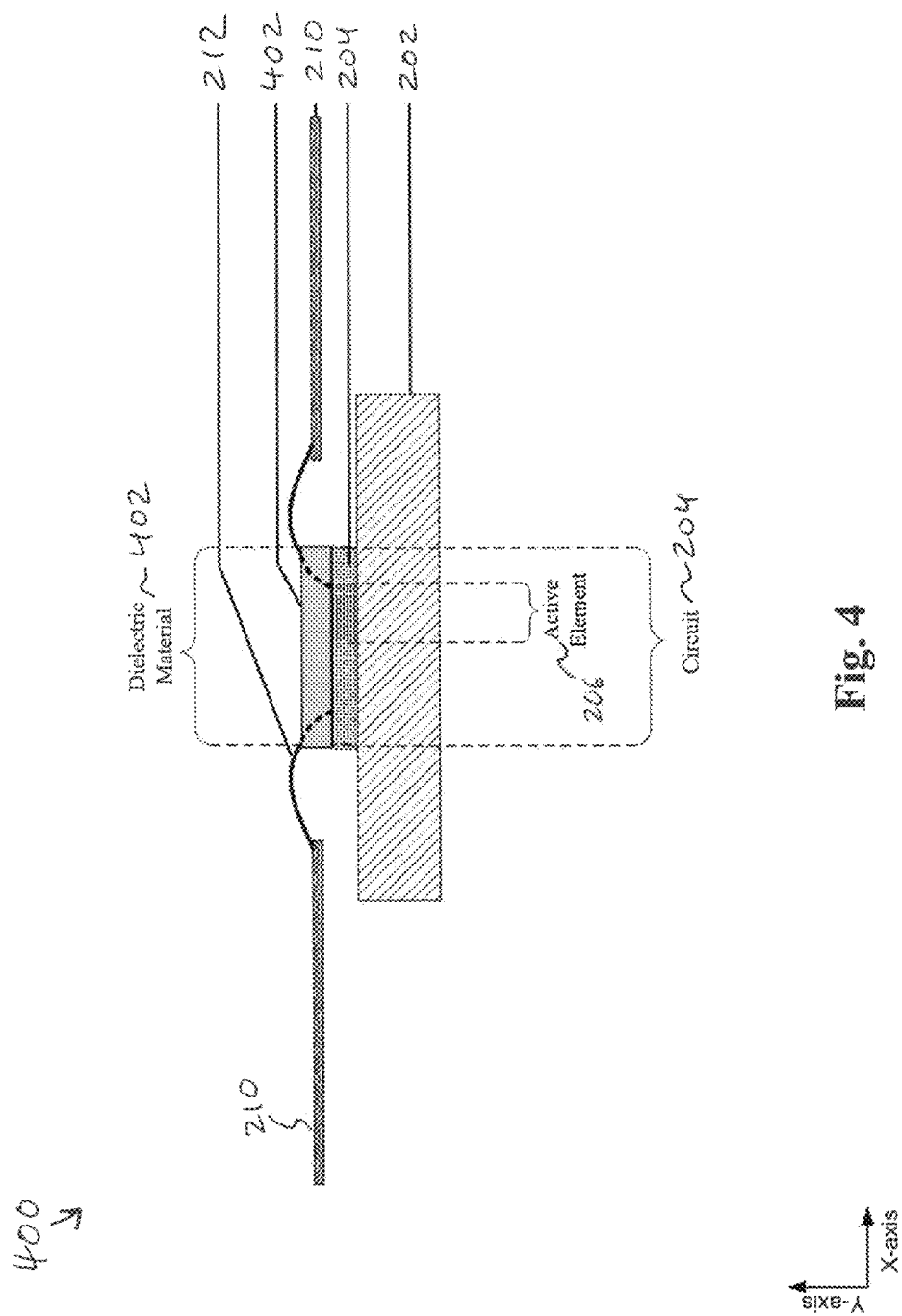
FIG. 4 shows a second example RF package.

FIG. 4 shows a second example RF package 400. In this example a dielectric material 402 covers an entire surface of the circuit 204, including both the active elements 206 and passive elements (i.e. the remainder of the circuit 204 which may include empty areas with no electrical or mechanical elements). Encapsulant would then be applied to cover all or part of the dielectric material 402, the circuit 204, the substrate 202, the bond-wires 212 and the lead-frame 210.

Figure 5:
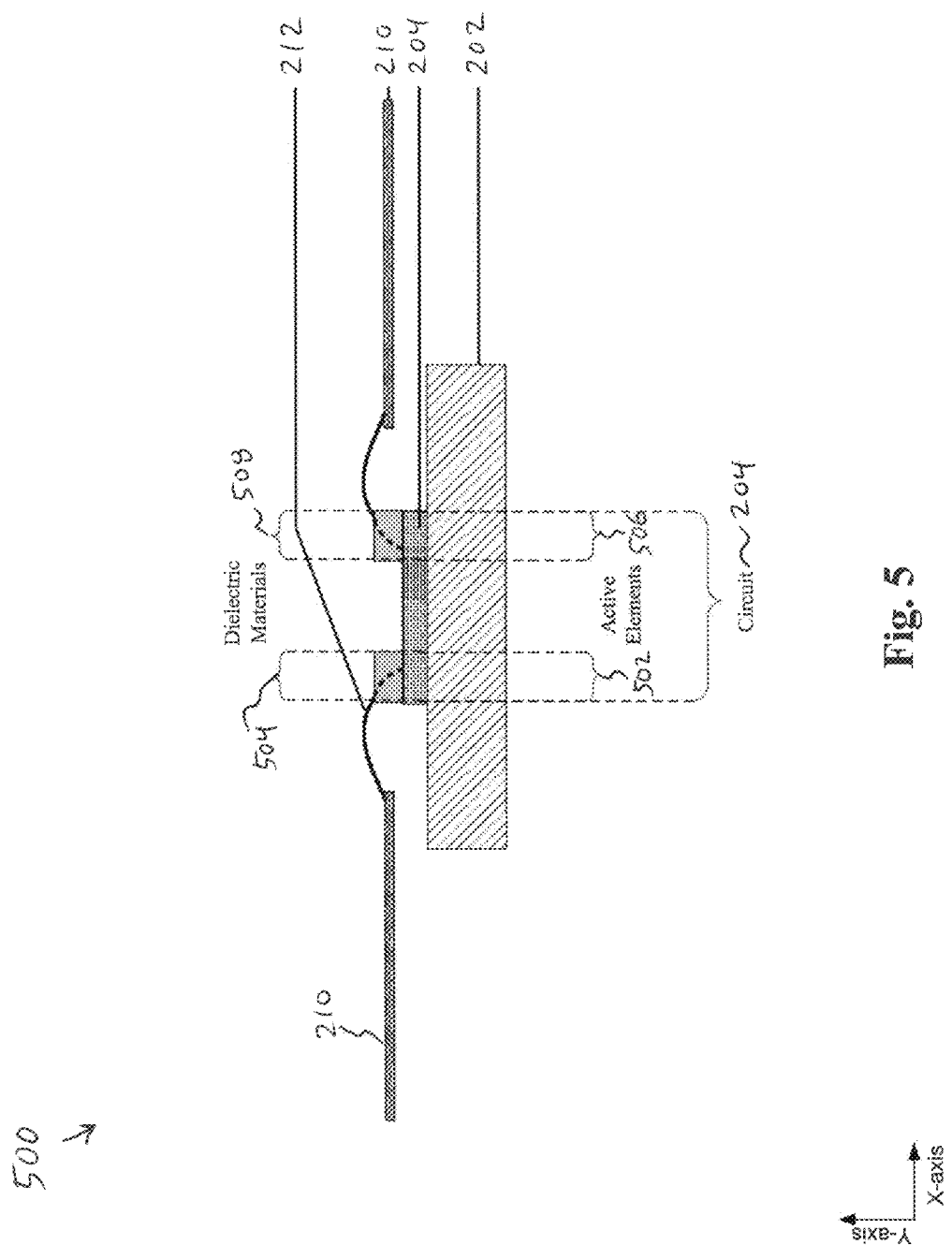
FIG. 5 shows a third example RF package.

FIG. 5 shows a third example RF package 500. The package 500 includes a first active element 502, covered by a first dielectric material 504, and a second active element 506, covered by a second dielectric material 508. The remainder of the circuit 204 may or may not include additional active or passive elements. Encapsulant would then be applied to cover all or part of the dielectric materials 504, 508, the circuit 204, the substrate 202, the bond-wires 212 and the lead-frame 210.

Figure 6:
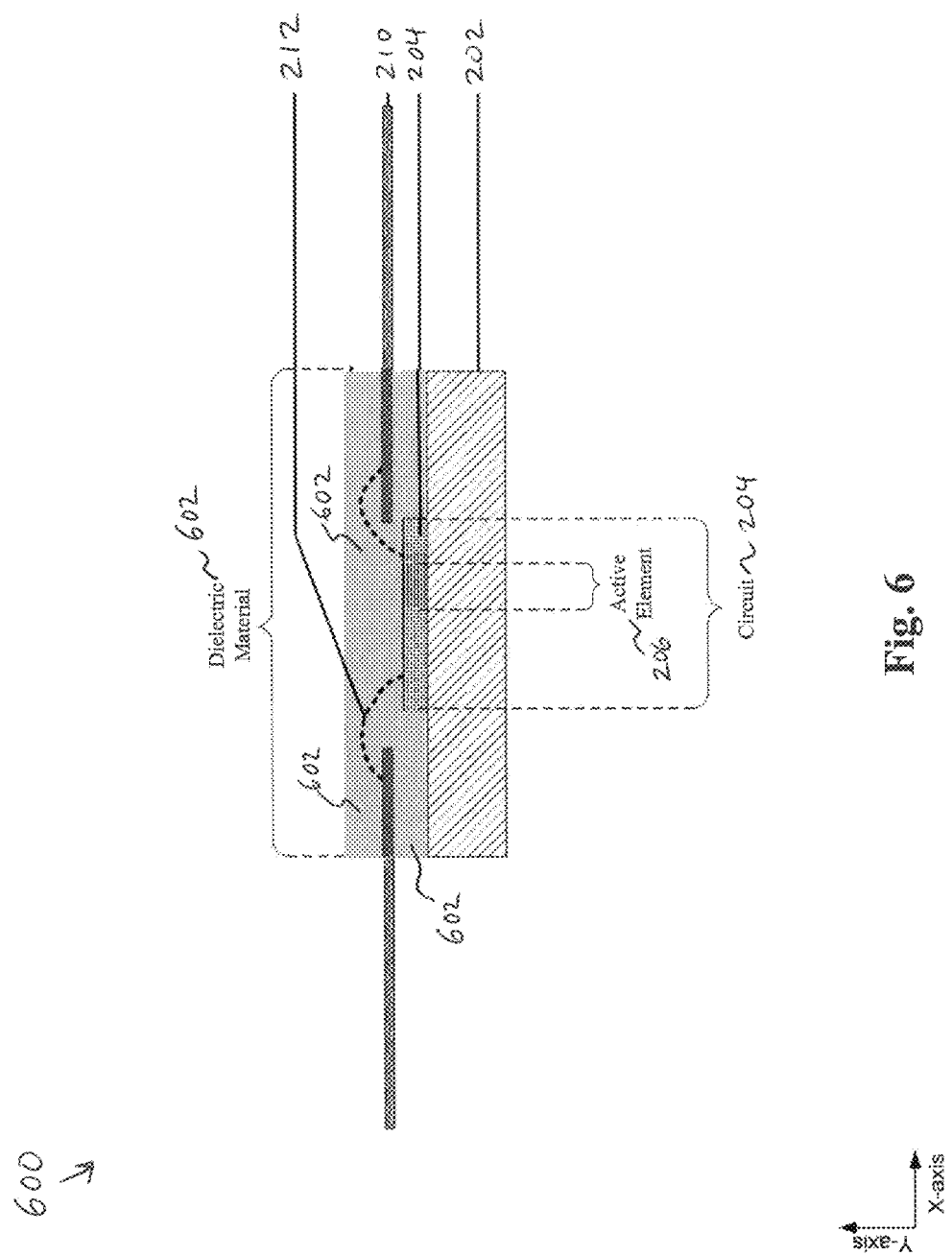
FIG. 6 shows a fourth example RF package.

FIG. 6 shows a fourth example RF package 600. In this example a dielectric material 602 covers not only an entire surface of the circuit 204, but also the entire substrate 202, the bond-wires 212 and a portion of the lead-frame 210. Encapsulant would then be applied to cover all or part of the dielectric material 602, the substrate 202 and lead-frame 210.

Figure 7A:
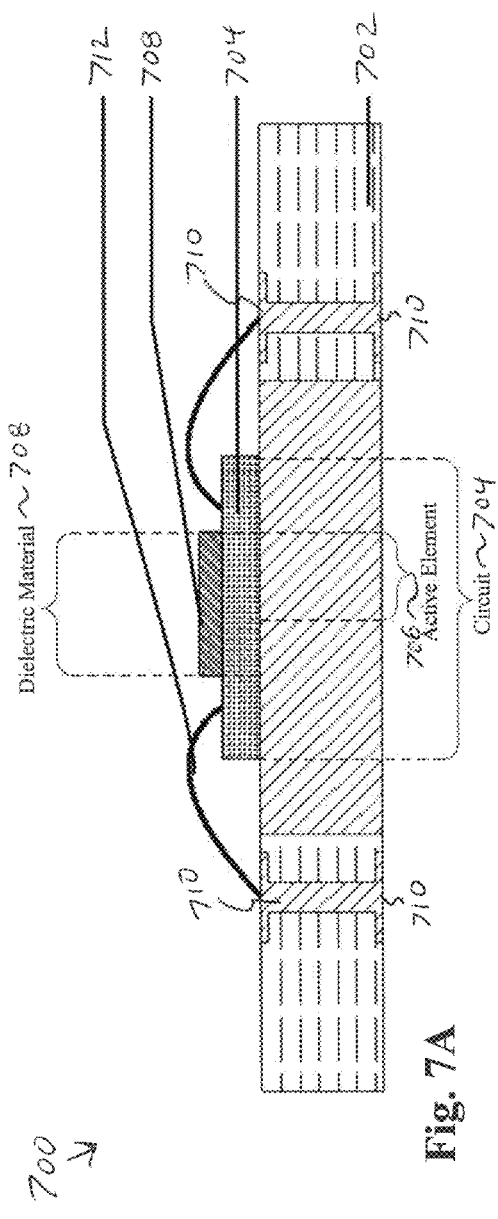
FIGS. 7A and 7B show a fifth example RF package.
Figure 7B:
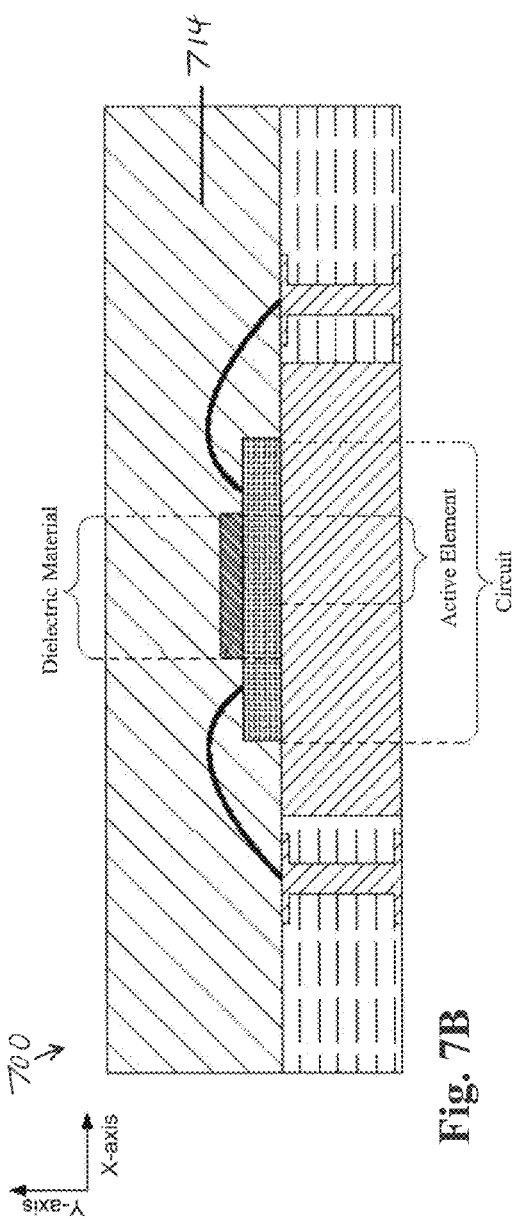

FIGS. 7A and 7B show a fifth example RF package 700. The package 700 includes a laminate 702 upon which a circuit 704 is affixed. In one example, the circuit 704 includes one or more active elements 706 and passive elements. A dielectric material 708 is placed over at least one of the active elements 706. The circuit 704 is connected to one or more terminals 710 (e.g. pin, via or contact) by one or more bond-wires 712. In one example an encapsulant material 714 covers the entire circuit 704, dielectric material 708, bond-wires 712 and at least one of the terminals 710. In other examples, the encapsulant material 714 may cover only part of the circuit 704, dielectric material 708 and bond-wires 712. The laminate 702 can be an organic material based substrate.

Figure 8:
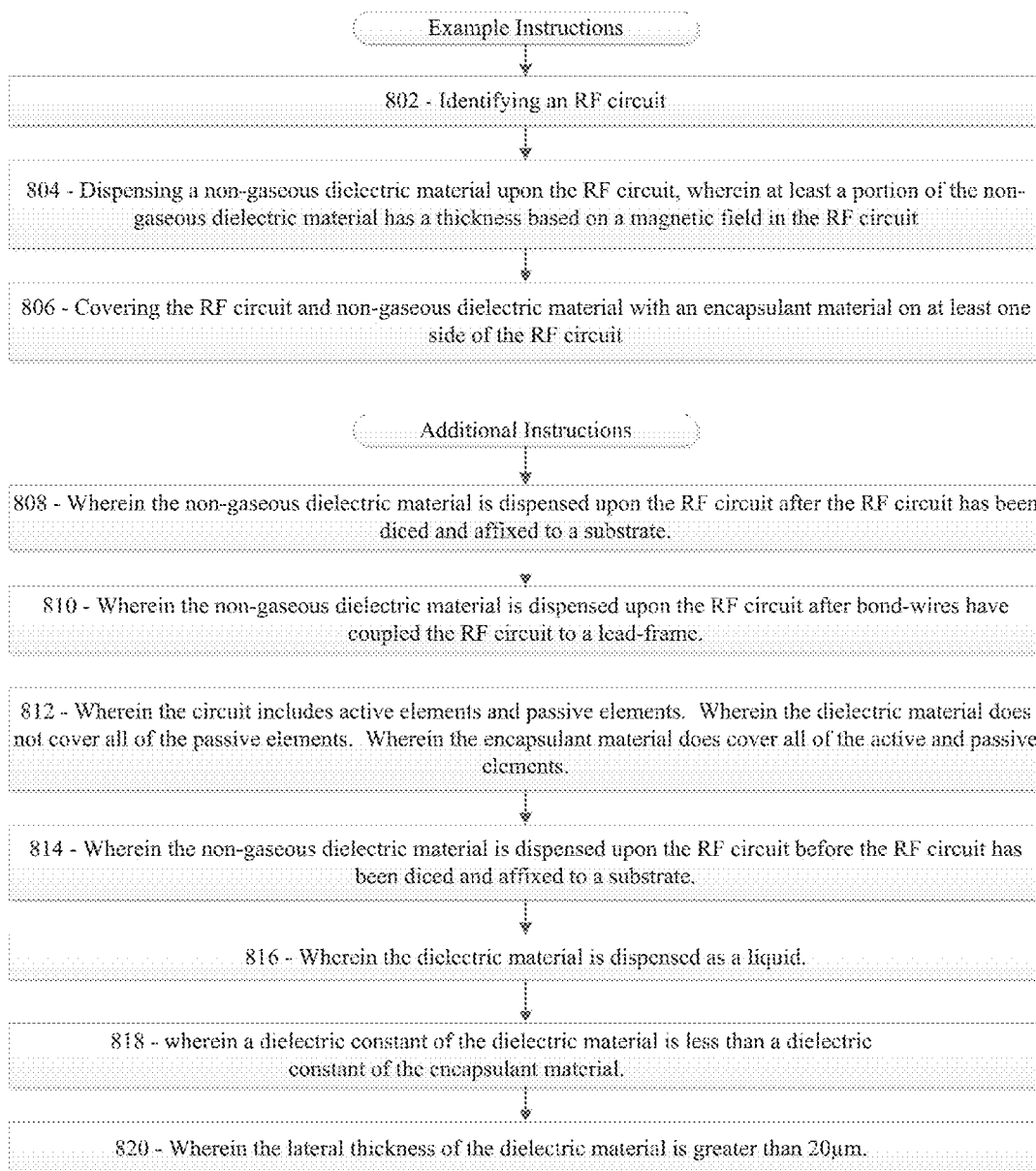
FIG. 8 is an example method for fabricating an RF package.

FIG. 8 is an example method for fabricating an RF package. The order in which the instructions are discussed does not limit the order in which other example embodiments implement the instructions. Additionally, in some embodiments the instructions are implemented concurrently.

A first example instruction begins in 802, by identifying an RF circuit. Next, in 804, dispensing a non-gaseous dielectric material upon the RF circuit, wherein at least a portion of the non-gaseous dielectric material has a thickness based on a magnetic field in the RF circuit. Then in 806, covering the RF circuit and non-gaseous dielectric material with an encapsulant material on at least one side of the RF circuit.

The instructions can be augmented with one or more of the following additional instructions, presented in no particular order. The additional instructions include: 808—wherein the non-gaseous dielectric material is dispensed upon the RF circuit after the RF circuit has been diced and affixed to a substrate. 810—wherein the non-gaseous dielectric material is dispensed upon the RF circuit after bond-wires have coupled the RF circuit to a lead-frame. 812—wherein the circuit includes active elements and passive elements; wherein the dielectric material does not cover all of the passive elements; and wherein the encapsulant material does cover all of the active and passive elements. 814—wherein the non-gaseous dielectric material is dispensed upon the RF circuit before the RF circuit has been diced and affixed to a substrate. 816—wherein the dielectric material is dispensed as a liquid. 818—wherein a dielectric constant of the dielectric material is less than a dielectric constant of the encapsulant material. 820—wherein the lateral thickness of the dielectric material is greater than 20 µm.

The instructions and/or flowchart steps in the above Figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions described above are implemented as functional and software instructions embodied as a set of executable instructions in a non-transient computer-readable or computer-usable media which are effected on a computer or machine programmed with and controlled by said executable instructions. Said instructions are loaded for execution on a processor (such as one or more CPUs). Said processor includes microprocessors, microcontrollers, processor modules or subsystems (including one or more microprocessors or microcontrollers), or other control or computing devices. A processor can refer to a single component or to plural components. Said computer-readable or computer-usable storage medium or media is (are) considered to be part of an article (or article of manufacture). An article or article of manufacture can refer to any manufactured single component or multiple components. The non-transient machine or computer-usable media or mediums as defined herein excludes signals, but such media or mediums may be capable of receiving and processing information from signals and/or other transient mediums.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. A package comprising:
   an RF circuit;
   a non-gaseous dielectric material coupled to the RF circuit, and having a thickness based on a magnetic field in the RF circuit; and
   an encapsulant material coupled to cover the RF circuit and non-gaseous dielectric material on at least one side of the RF circuit.

2. The package of claim 1:
   wherein the dielectric material is a low-k dielectric material.

3. The package of claim 1:
   wherein a dielectric constant of the dielectric material is less than a dielectric constant of the encapsulant material.

4. The package of claim 1:
   wherein the circuit includes active elements and passive elements; and
   wherein the dielectric material does not cover all of the passive elements.

5. The package of claim 1:
   further comprising a lead-frame and a set of bond-wires;
   wherein a first bond-wire couples the circuit to the lead-frame;
   wherein the dielectric material completely covers a second bond-wire; and
   wherein the encapsulant further covers the first bond-wire, the second bond-wire and a portion of the lead-frame.

6. The package of claim 5:
   further comprising a second circuit completely covered by the dielectric material; and
   wherein the second bond-wire couples the RF circuit to the second circuit.

7. The package of claim 1:
   wherein the RF circuit includes a device operating at a frequency of at least 1 GHz.

8. The package of claim 1:
   wherein the circuit is a semiconductor die.

9. The package of claim 1:
   wherein the encapsulant material is coupled to encapsulate the RF circuit and non-gaseous dielectric material.

10. The package of claim 1:
    wherein the thickness is at least 20 µm.

11. A package comprising:
    an RF circuit having a first portion and a second portion;

a non-gaseous dielectric material coupled only to the first portion of the RF circuit; and an encapsulant material coupled to cover the RF circuit and non-gaseous dielectric material on at least one side of the RF circuit.

\* \* \* \* \*